United States Patent
Tsai

(10) Patent No.: US 10,601,435 B2
(45) Date of Patent: Mar. 24, 2020

(54) INITIAL BOOTING BOOTSTRAP CIRCUIT AND ASSOCIATED ANALOG-TO-DIGITAL CONVERTER

(71) Applicant: MEDIATEK INC., Hsin-Chu (TW)

(72) Inventor: Wei-Hao Tsai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/398,199

(22) Filed: Apr. 29, 2019

(65) Prior Publication Data

US 2019/0363725 A1    Nov. 28, 2019

Related U.S. Application Data

(60) Provisional application No. 62/675,224, filed on May 23, 2018, provisional application No. 62/675,791, filed on May 24, 2018.

(51) Int. Cl.
*H03M 1/12* (2006.01)

(52) U.S. Cl.
CPC .................................... *H03M 1/12* (2013.01)

(58) Field of Classification Search
CPC ...................................................... H03M 1/12
USPC ........................................................ 341/155
See application file for complete search history.

(56) References Cited

U.S. PATENT DOCUMENTS

| | | | | |
|---|---|---|---|---|
| 5,184,035 A * | 2/1993 | Sugibayashi | ............ | G11C 8/08 326/33 |
| 6,060,937 A | 5/2000 | Singer | | |
| 6,172,493 B1 * | 1/2001 | Grant | ............ | H02M 7/538 323/224 |
| 6,249,154 B1 | 6/2001 | Jouffre | | |
| 6,518,901 B2 | 2/2003 | Pinna | | |
| 7,609,036 B2 * | 10/2009 | Bartolo | ............ | H02M 3/157 323/224 |
| 7,710,164 B1 | 5/2010 | Sharma | | |
| 7,737,773 B2 * | 6/2010 | Kanamori | ............ | H02M 3/156 326/88 |
| 8,674,863 B2 | 3/2014 | Grilo | | |
| 8,779,733 B2 * | 7/2014 | Chen | ............ | H02M 1/08 323/259 |
| 9,484,758 B2 * | 11/2016 | Chen | ............ | H02J 7/0052 |
| 10,108,300 B2 * | 10/2018 | Tang | ............ | G06F 3/044 |

(Continued)

FOREIGN PATENT DOCUMENTS

| EP | 1 494 357 A1 | 1/2005 |
|---|---|---|
| KR | 10-2012-0052478 A | 5/2012 |

OTHER PUBLICATIONS

Liu, "A 10-bit 50-MS/s SAR ADC With a Monotonic Capacitor Switching Procedure", IEEE Journal of Solid-State Circuits, vol. 45, No. 4, Apr. 2010.

*Primary Examiner* — Jean B Jeanglaude
(74) *Attorney, Agent, or Firm* — Winston Hsu

(57) ABSTRACT

A bootstrap circuit including a receiving circuit, a switched capacitor module and a booting circuit is provided. The receiving circuit receives an input signal to selectively output an output signal according to a control signal. The switched capacitor module is coupled to the input signal, and is arranged for generating the control signal according to the input signal. The booting circuit is coupled to the receiving circuit, and is arranged for applying an initial voltage when the control signal starts to enable the transistor, to increase a voltage level of the control signal.

14 Claims, 4 Drawing Sheets

(56) References Cited

U.S. PATENT DOCUMENTS

2008/0100378 A1\* 5/2008 Bernacchia ......... H02M 7/5388
327/589
2018/0076807 A1\* 3/2018 Devarajan ............ H03K 17/005

\* cited by examiner

US 10,601,435 B2

INITIAL BOOTING BOOTSTRAP CIRCUIT AND ASSOCIATED ANALOG-TO-DIGITAL CONVERTER

CROSS REFERENCE TO RELATED APPLICATIONS

This application claims the priority of U.S. Provisional Application No. 62/675,224, filed on May 23, 2018, and U.S. Provisional Application No. 62/675,791, filed on May 24, 2018, which is included herein by reference in its entirety.

BACKGROUND

In a conventional bootstrap circuit, a switched capacitor is provided within to generate a booting voltage based on an input signal. Ideally, the booting voltage is equal to a summation of the input signal and a reference voltage such as a supply voltage, however, the booting voltage may not reach the goal due to parasitic capacitance at output nodes of the switched capacitor, and the operations of the following circuits may be influenced.

SUMMARY

It is therefore an objective of the present invention to provide a bootstrap circuit, which can lower the influence of the parasitic capacitance, to solve the above-mentioned problem.

According to one embodiment of the present invention, a bootstrap circuit including a receiving circuit, a switched capacitor module and a booting circuit is provided. The receiving circuit receives an input signal to selectively output an output signal according to a control signal. The switched capacitor module is coupled to the input signal, and is arranged for generating the control signal according to the input signal. The booting circuit is coupled to the receiving circuit, and is arranged for applying an initial voltage when the control signal starts to enable the transistor, to increase a voltage level of the control signal.

According to another embodiment of the present invention, an analog-to-digital converter comprising a bootstrap circuit and a converting circuit is provided, wherein the bootstrap circuit comprises a receiving circuit, a switched capacitor module and a booting circuit. The receiving circuit receives an input signal to selectively output an output signal according to a control signal. The switched capacitor module is coupled to the input signal, and is arranged for generating the control signal according to the input signal. The booting circuit is coupled to the receiving circuit, and is arranged for applying an initial voltage when the control signal starts to enable the transistor, to increase a voltage level of the control signal. The converting circuit is coupled to the bootstrap circuit, and is arranged for performing analog-to-digital converting operations upon the output signal to generate a digital signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
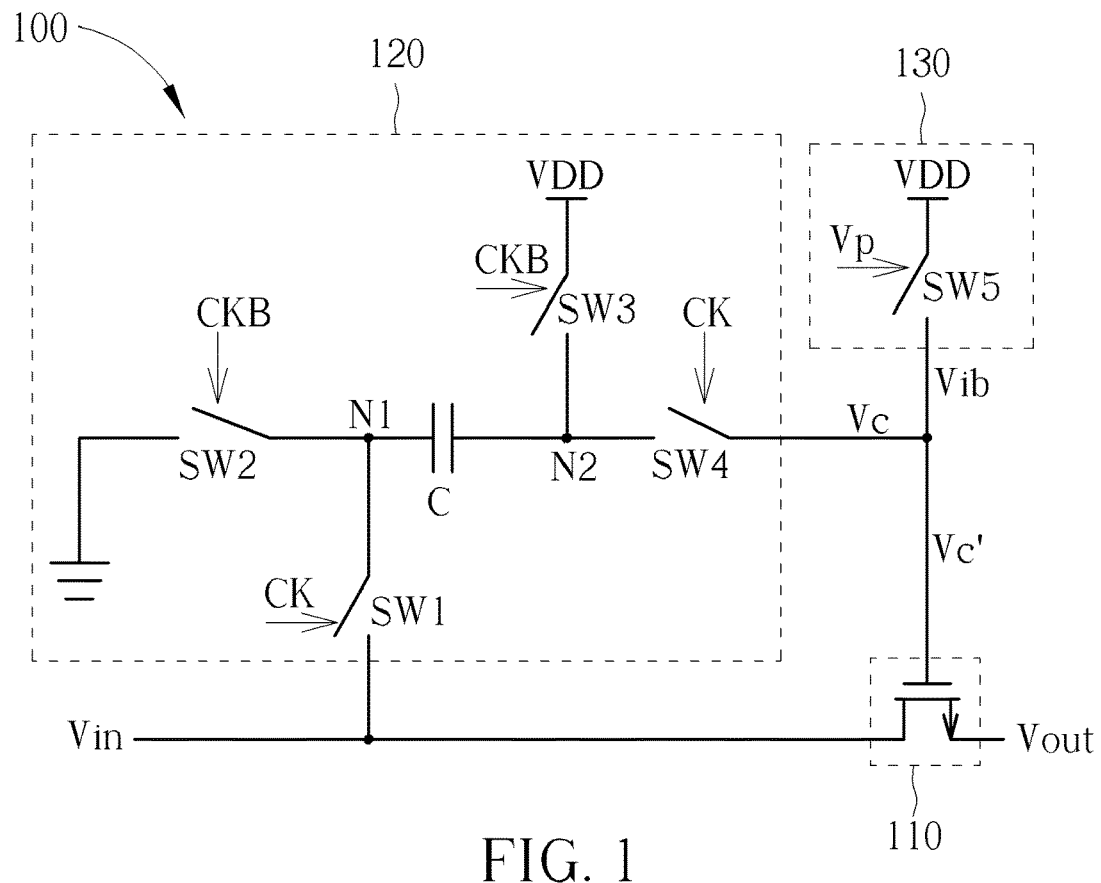
FIG. 1 is a diagram illustrating a bootstrap circuit according to one embodiment of the present invention.

FIG. 1 is a diagram illustrating a bootstrap circuit 100 according to one embodiment of the present invention. As shown in FIG. 1, the bootstrap circuit 100 comprises a receiving circuit (in this embodiment, a transistor 110 is used to implement the receiving circuit), a switched capacitor module 120 and a booting circuit 130. In this embodiment, the transistor 110 is implemented by an N-type Metal-Oxide-Semiconductor (NMOS), and the transistor 110 is configured to receive an input signal Vin at a drain electrode to generate an output signal Vout at a source electrode according to an adjusted control signal Vc' at a gate electrode. The switched capacitor module 120 comprises a plurality of switches SW1-SW4 and a capacitor C, wherein the switch SW1 is coupled between a first terminal N1 of the capacitor C and the input signal Vin, and is configured to selectively connect the input signal Vin to the first terminal N1 of the capacitor according to a clock signal CLK; the switch SW2 is coupled between the first terminal N1 of the capacitor C and a ground voltage, and is configured to selectively connect the ground voltage to the first terminal N1 of the capacitor C according to an inverted clock signal CKB; the switch SW3 is coupled between a second terminal N2 of the capacitor C and a supply voltage VDD, and is configured to selectively connect the supply voltage VDD to the second terminal N2 of the capacitor C according to the inverted clock signal CKB; and the switch SW4 is coupled between the second terminal N2 of the capacitor C and the gate electrode of the transistor 110, and is configured to selectively connect the second terminal N2 of the capacitor C to the gate electrode of the transistor 100 according to the clock signal CK. The booting circuit 130 comprises a control switch SW5 coupled between the supply voltage VDD and the gate electrode of the transistor 110, and is configured to refer to a signal Vp to selectively connect the supply voltage VDD to provide an initial voltage Vib to the gate electrode of the transistor 110, to adjust a control signal Vc generated by the switched capacitor module 120 to generate the adjusted control signal Vc'.

Figure 2:
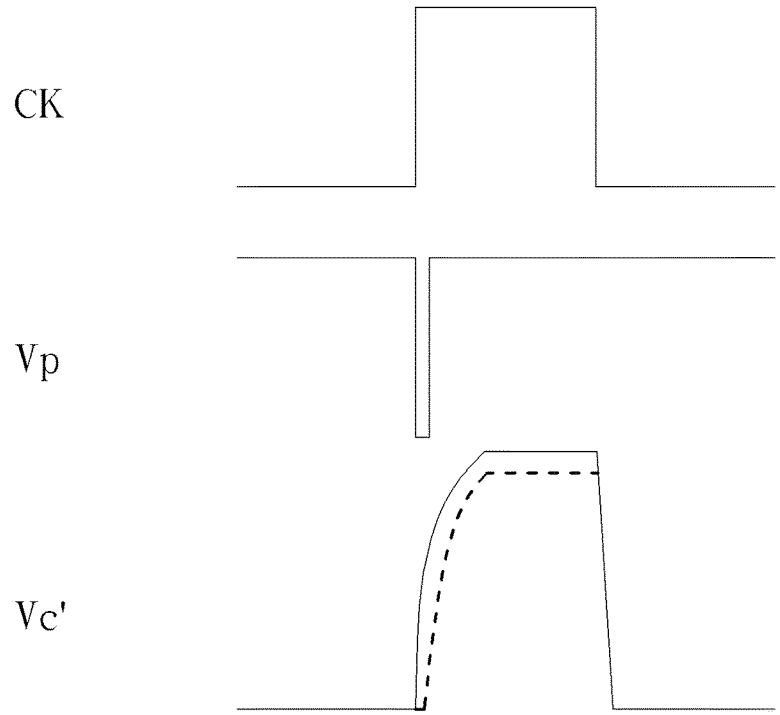
FIG. 2 shows the clock signal, the signal for controlling the control switch, and the adjusted control signal according to one embodiment of the present invention.

In the operations of the bootstrap circuit 100, the transistor 110 refers to the adjusted control signal Vc' to selectively generate the output signal Vout based on the input signal Vin, that is when the clock signal is at a low voltage level, the adjusted control signal Vc' generated by switched capacitor module 120 and the booting circuit 130 disables the transistor 110, and the bootstrap circuit 100 does not generate the output signal Vout; and when the clock signal is at a high voltage level, the adjusted control signal Vc' generated by switched capacitor module 120 and the booting circuit 130 enables the transistor 110, and the input signal Vin passes through the transistor 110 to generate the output signal Vout. In addition, the booting circuit 130 is configured to generate the initial voltage Vib at a rising edge of the control signal Vc (or the rising edge of the clock signal CK), to increase the level of the control signal Vc to generate the adjusted control signal Vc', as shown in FIG. 2. In the embodiment shown in FIG. 2, the dotted line is the control signal Vc if the booting circuit 130 is removed from the bootstrap circuit 100. By using the booting circuit 130 to provide the initial voltage Vib to the gate electrode of the transistor 110, the transistor 110 may have lower impedance and the output signal Vout may have better linearity, and the signal quality is improved and is more suitable for the following circuits.

In detail, when the clock signal CK is at the low voltage level, the switches SW1 and SW4 are disabled, the switches SW2 and SW3 are enabled, the first terminal N1 of the capacitor C is the ground voltage, and the second terminal N2 of the capacitor C is the supply voltage. At this time, the gate electrode of the transistor 110 can be connected to the ground voltage by using another circuit (not shown in this embodiment), and the transistor 110 is disabled and the input signal Vin does not pass through the transistor 110. When the clock signal CK starts to goes high, the switches SW1 and SW4 are enabled, the switches SW2 and SW3 are disabled, and the control signal Vc is boosted from VDD to (VDD+Vin) to enabled the transistor 110, and the input signal Vin passes through the transistor 110 to generate the output signal Vout. However, due to the parasitic capacitance at the gate electrode of the transistor 110, the control signal Vc may not reach the desired level (VDD+Vin). To solve this problem, the booting circuit 130 provides the initial voltage Vib to increase the level of the control signal Vc, to make the adjusted control signal Vc' have the voltage level approaching (VDD+Vin).

In this embodiment, the initial voltage Vib generated by the booting circuit 130 is a pulse signal, that is the initial voltage Vib is provided to the gate electrode of the transistor 110 only when the control signal Vc starts to enable the transistor 110 (e.g., at the rising edge of the control signal, or at the rising edge of the clock signal CK). This setting can improve the performance of the bootstrap circuit 100 without introducing other side effects.

Figure 3:
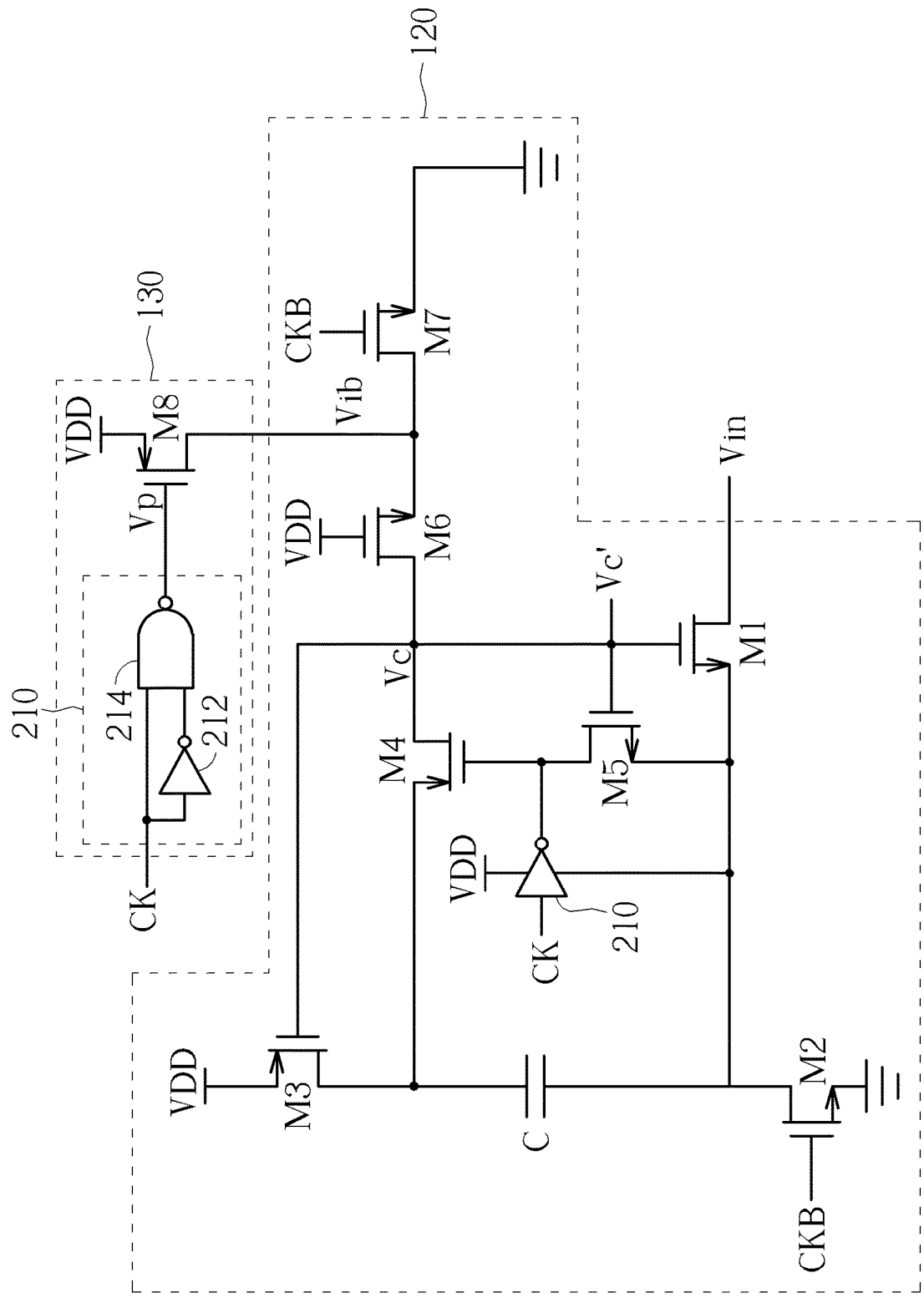
FIG. 3 is a diagram illustrating the switched capacitor module and the booting circuit according a first embodiment of the present invention.

It is noted that the transistor 110 in FIG. 1 is for illustratively purposes only. In other embodiment, the transistor 110 can be replaced by any other receiving circuit which can be enable or disabled according to the adjusted control signal Vc', to selectively generate the output signal Vout to the following circuit FIG. 3 is a diagram illustrating the switched capacitor module 120 and the booting circuit 130 according a first embodiment of the present invention. As shown in FIG. 3, the switched capacitor module 120 comprises transistors M1-M7, a capacitor C and an inverter 210, and the booting circuit 130 comprises a pulse generator 210 and a control transistor M8 serving as the control switch SW5 shown in FIG. 1, wherein the pulse generator 210 comprises an inverter 212 and a NAND gate 214.

In the operations of the embodiment shown in FIG. 3, when the clock signal CK is at the low voltage level, the transistors M6 and M7 are enabled to make the adjusted control signal Vc' be the ground voltage, and the transistor 110 shown in FIG. 1 is disabled and the input signal Vin does not pass through the transistor 110. When the clock signal CK starts to goes high, the transistor M7 is disabled, the transistors M1-M5 and the capacitor C generate the control signal Vc, the pulse generator 210 generates a pulse to enable the control transistor M8 to provide the initial voltage Vib, and the initial voltage Vib passes through the transistor M6 to increase the voltage level of the control signal Vc to generate the adjusted control signal Vc'.

In the embodiment shown in FIG. 3, because the initial voltage Vib is provided to the control signal Vc via the transistor M6, the parasitic capacitance caused by the booting circuit 130 will not seriously influence the adjusted control signal Vc'.

Figure 4:
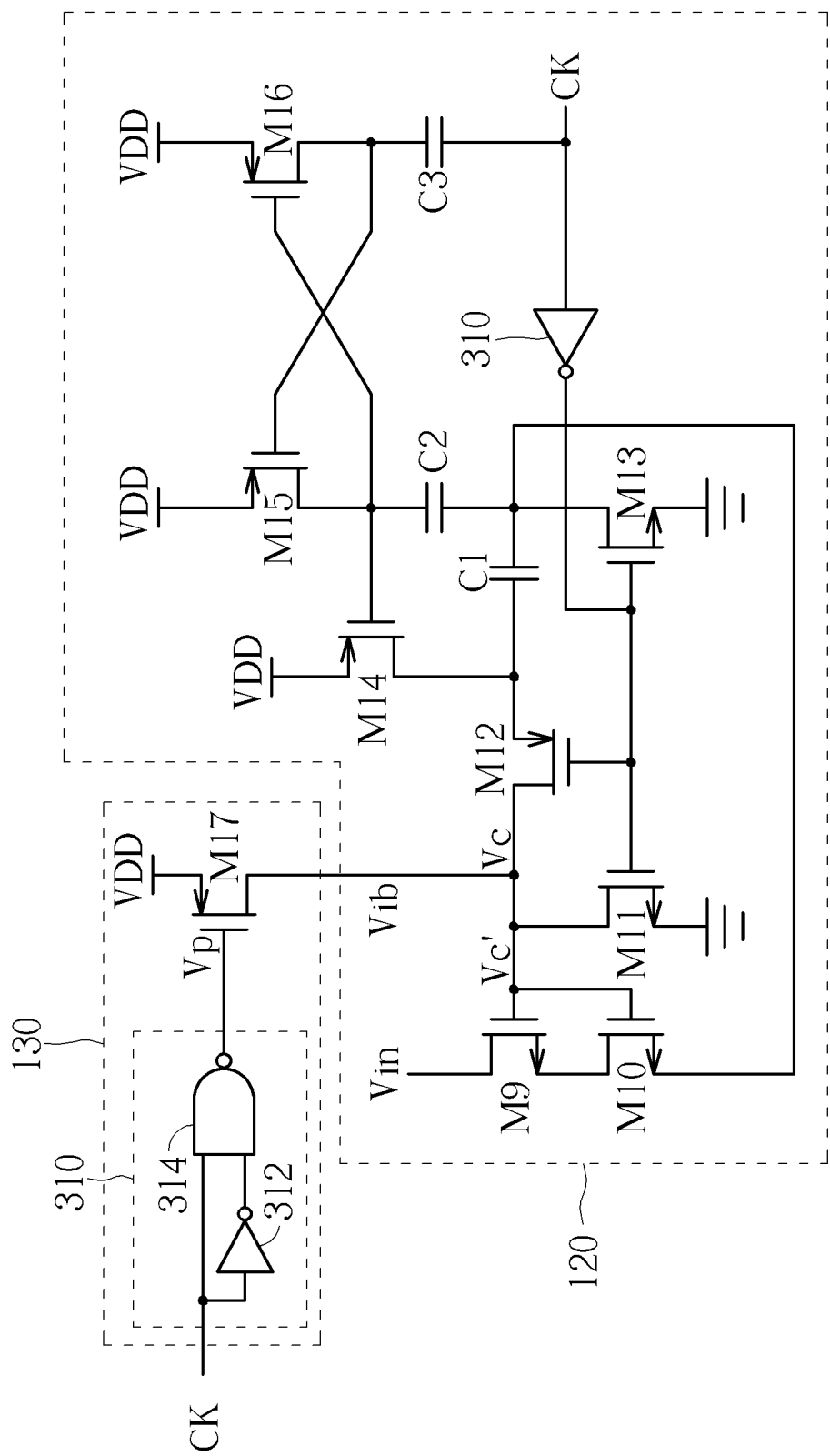
FIG. 4 is a diagram illustrating the switched capacitor module and the booting circuit according a second embodiment of the present invention.

FIG. 4 is a diagram illustrating the switched capacitor module 120 and the booting circuit 130 according a second embodiment of the present invention. As shown in FIG. 4, the switched capacitor module 120 comprises transistors M9-M16, three capacitors C1-C3 and an inverter 310, and the booting circuit 130 comprises a pulse generator 310 and a control transistor M17 serving as the control switch SW5 shown in FIG. 1, wherein the pulse generator 310 comprises an inverter 312 and a NAND gate 314.

In the operations of the embodiment shown in FIG. 4, when the clock signal CK is at the low voltage level, the transistor M11 are enabled to make the adjusted control signal Vc' be the ground voltage, and the transistor 110 shown in FIG. 1 is disabled and the input signal Vin does not pass through the transistor 110. When the clock signal CK starts to goes high, the transistors M9-M16 and the capacitors C1-C3 generate the control signal Vc, the pulse generator 310 generates a pulse to enable the control transistor M17 to provide the initial voltage Vib to increase the voltage level of the control signal Vc to generate the adjusted control signal Vc'.

It is noted that the embodiments shown in FIG. 3 and FIG. 4 are for illustrative purposes only, without a limitation of the present invention. As long as the bootstrap circuit comprises the booting circuit (initial booting circuit) for providing the initial voltage at the rising edge of the control signal Vc, to increase the control signal Vc applied to the gate electrode of the transistor 110 shown in FIG. 1, the switched capacitor module 120 and the booting circuit 130 may have other circuit structures, and these alternative designs shall fall within the scope of the present invention.

Figure 5:
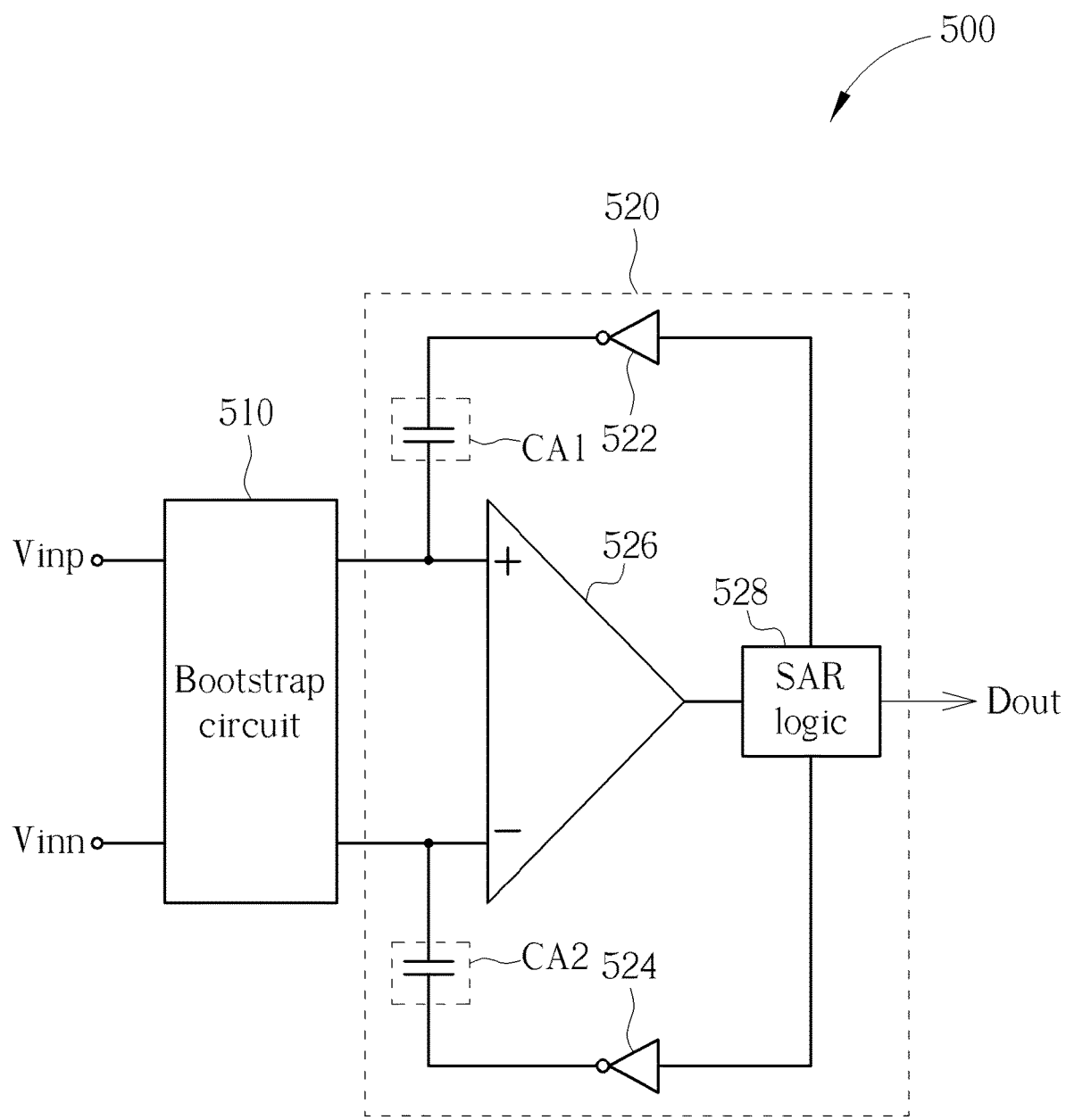
FIG. 5 is a diagram illustrating an ADC according to one embodiment of the present invention.

The bootstrap circuit 100 shown in FIG. 1 can be applied to any analog circuit, especially to the analog circuit having high frequency and high amplitude. For example, the bootstrap circuit 100 can be applied to an input of an analog-to-digital converter (ADC). FIG. 5 shows an ADC 500 according to one embodiment of the present invention. As shown in FIG. 5, the ADC 500 comprises a bootstrap circuit 510 and an analog-to-digital converting circuit 520, wherein the analog-to-digital converting circuit 520 comprises two capacitor arrays CA1 and CA2, two inverters 522 and 524, an operational amplifier 526 and a successive approximation register (SAR) logic 528. In the embodiment shown in FIG. 5, the bootstrap circuit 510 may be implemented by two bootstrap circuits 100 shown in FIG. 1, and the bootstrap circuit 510 is configured to periodically passes input signals Vinp and Vinn to the analog-to-digital converting circuit 520, and the analog-to-digital converting circuit 520 converts the input signals Vinp and Vinn into a digital signal Dout. It is noted that the analog-to-digital converting circuit 520 merely shows the basic structure, because a person skilled in the art should understand the operations of the ADC, further descriptions are therefore omitted here.

In addition, the SAR ADC shown in FIG. 5 is for illustrative purposes only, in other embodiments, the bootstrap circuit 100 can be applied to a pipeline ADC, a flash ADC or a sigma-delta modulator.

Briefly summarized, in the bootstrap circuit of the present invention, the booting circuit is provided to increase the voltage level of the control signal applied to the transistor for allowing the input signal to pass through to generate the output signal. Therefore, the linearity of bootstrap circuit can be improved, and the output signal will be more suitable for the following circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bootstrap circuit, comprising:
   a receiving circuit, for receiving an input signal to selectively output an output signal according to a control signal;
   a switched capacitor module, for generating the control signal according to the input signal; and
   a booting circuit, coupled to the receiving circuit, for applying an initial voltage when the control signal starts to enable receiving circuit, to increase a voltage level of the control signal.

2. The bootstrap circuit of claim 1, wherein the receiving circuit is a transistor, the transistor comprises a gate electrode, a first electrode and a second electrode, and the transistor receives the input signal at the first electrode to generate the output signal at the second electrode according to the control signal at the gate electrode.

3. The bootstrap circuit of claim 2, wherein the booting circuit applies the initial voltage to the gate electrode of the transistor only when the control signal starts to enable the transistor.

4. The bootstrap circuit of claim 3, wherein the initial voltage is a pulse signal.

5. The bootstrap circuit of claim 1, wherein the switched capacitor module is controlled by using a clock signal and an inverted clock signal, and the booting circuit generates the initial voltage according to the clock signal or the inverted clock signal.

6. The bootstrap circuit of claim 5, wherein the switched capacitor module comprises:
   a capacitor having a first terminal and a second terminal;
   a first switch, coupled between the first terminal of the capacitor and the input signal, for selectively connecting the input signal to the first terminal of the capacitor according to the clock signal;
   a second switch, coupled between the first terminal of the capacitor and a ground voltage, for selectively connecting the ground voltage to the first terminal of the capacitor according to the inverted clock signal;
   a third switch, coupled between the second terminal of the capacitor and a supply voltage, for selectively connecting the supply voltage to the second terminal of the capacitor according to the inverted clock signal; and
   a fourth switch, coupled between the second terminal of the capacitor and the receiving circuit, for selectively connecting the second terminal of the capacitor to the receiving circuit according to the clock signal.

7. The bootstrap circuit of claim 5, wherein the booting circuit comprises:
   a pulse generator, for receiving the clock signal or the inverted clock signal to generate a pulse signal; and
   a control transistor comprising a gate electrode, a first electrode and a second electrode, wherein the first electrode of the control transistor is coupled to the supply voltage, the control transistor receives the pulse signal at the gate electrode to selectively connect the supply voltage to the second electrode to generate the initial voltage.

8. An analog-to-digital converter, comprising:
   a bootstrap circuit, comprising:
      a receiving circuit, for receiving an input signal to selectively output an output signal according to a control signal;
      a switched capacitor module, for generating the control signal according to the input signal; and
      a booting circuit, coupled to the receiving circuit, for applying an initial voltage when the control signal starts to enable the receiving circuit, to increase a voltage level of the control signal; and
   a converting circuit, coupled to the bootstrap circuit, for performing analog-to-digital converting operations upon the output signal to generate a digital signal.

9. The analog-to-digital converter of claim 8, wherein the receiving circuit is a transistor, the transistor comprises agate electrode, a first electrode and a second electrode, and the transistor receives the input signal at the first electrode to generate the output signal at the second electrode according to the control signal at the gate electrode.

10. The analog-to-digital converter of claim 9, wherein the booting circuit applies the initial voltage to the gate electrode of the transistor only when the control signal starts to enable the transistor.

11. The analog-to-digital converter of claim 10, wherein the initial voltage is a pulse signal.

12. The analog-to-digital converter of claim 8, wherein the switched capacitor module is controlled by using a clock signal and an inverted clock signal, and the booting circuit generates the initial voltage according to the clock signal or the inverted clock signal.

13. The analog-to-digital converter of claim 12, wherein the switched capacitor module comprises:
   a capacitor having a first terminal and a second terminal;
   a first switch, coupled between the first terminal of the capacitor and the input signal, for selectively connecting the input signal to the first terminal of the capacitor according to the clock signal;
   a second switch, coupled between the first terminal of the capacitor and a ground voltage, for selectively connecting the ground voltage to the first terminal of the capacitor according to the inverted clock signal;
   a third switch, coupled between the second terminal of the capacitor and a supply voltage, for selectively connecting the supply voltage to the second terminal of the capacitor according to the inverted clock signal; and
   a fourth switch, coupled between the second terminal of the capacitor and the receiving circuit, for selectively connecting the second terminal of the capacitor to the receiving circuit according to the clock signal.

14. The analog-to-digital converter of claim. 12, wherein the booting circuit comprises:

a pulse generator, for receiving the clock signal or the inverted clock signal to generate a pulse signal; and a control transistor comprising a gate electrode, a first electrode and a second electrode, wherein the first electrode of the control transistor is coupled to the supply voltage, the control transistor receives the pulse signal at the gate electrode to selectively connect the supply voltage to the second electrode to generate the initial voltage.

* * * * *